United States Patent
Takemori et al.

(10) Patent No.: US 7,573,096 B2
(45) Date of Patent: Aug. 11, 2009

(54) SEMICONDUCTOR DEVICE FOR REDUCING FORWARD VOLTAGE BY USING OHMIC CONTACT

(75) Inventors: Toshiyuki Takemori, Hanno (JP); Yuji Watanabe, Hidaka (JP); Fuminori Sasaoka, Hanno (JP); Kazushige Matsuyama, Tsukuba (JP); Kunihito Ohshima, Kawagoe (JP); Masato Itoi, Hanno (JP)

(73) Assignee: Shindengen Electric Manufacturing Co, Ltd., Tokyo (JP)

( * ) Notice: Subject to any disclaimer, the term of this patent is extended or adjusted under 35 U.S.C. 154(b) by 0 days.

(21) Appl. No.: 11/883,939

(22) PCT Filed: Feb. 16, 2005

(86) PCT No.: PCT/JP2005/002312

§ 371 (c)(1),
(2), (4) Date: Aug. 8, 2007

(87) PCT Pub. No.: WO2006/087775

PCT Pub. Date: Aug. 24, 2006

(65) Prior Publication Data

US 2008/0135925 A1    Jun. 12, 2008

(51) Int. Cl.
*H01L 29/76* (2006.01)
*H01L 29/94* (2006.01)
*H01L 31/062* (2006.01)
*H01L 31/113* (2006.01)

(52) U.S. Cl. .............. 257/330; 257/331; 257/332; 257/E27.091

(58) Field of Classification Search .............. 257/330, 257/331, 332, E27.091
See application file for complete search history.

(56) References Cited

U.S. PATENT DOCUMENTS

| 6,049,108 | A * | 4/2000 | Williams et al. ............ 257/341 |
| 6,351,018 | B1 | 2/2002 | Sapp | |
| 2001/0000919 | A1 | 5/2001 | Kocon | |

(Continued)

FOREIGN PATENT DOCUMENTS

EP    0 746 042    12/1996

(Continued)

OTHER PUBLICATIONS

International Search Report mailed Apr. 19, 2005 (Japanse and English Translation).

(Continued)

*Primary Examiner*—Phat X Cao
(74) *Attorney, Agent, or Firm*—Nixon & Vanderhye P.C.

(57) ABSTRACT

MOS FETs are formed by a drain layer 101, a drift layer 102, P-type body areas 103, N$^+$-type source areas 105, gate electrodes 108, a source electrode film 110, and a drain electrode film 111. In parallel to the MOS FETs, the drain layer 101, the drift layer 102, the P$^-$-type diffusion area 109, and the source electrode film 110 form a diode. The source electrode film 110 and the P$^-$-type diffusion area 109 form an Ohmic contact. The total amount of impurities, which function as P-type impurities in each P-type body area 103, is larger than the total amount of impurities, which function as P-type impurities in the P$^-$-type diffusion area 109.

9 Claims, 14 Drawing Sheets

U.S. PATENT DOCUMENTS

2006/0060916 A1 * 3/2006 Girdhar et al. .............. 257/330

FOREIGN PATENT DOCUMENTS

| JP | 01-192174 | 8/1989 |
| JP | 09-102606 | 4/1997 |
| JP | 11-307785 | 11/1999 |
| JP | 2000-353805 | 12/2000 |
| JP | 2001-274399 | 10/2001 |

OTHER PUBLICATIONS

Written Opinion dated Apr. 19, 2005.

* cited by examiner (PRIOR ART)

SEMICONDUCTOR DEVICE FOR REDUCING FORWARD VOLTAGE BY USING OHMIC CONTACT

This application is the U.S. national phase of International Application No. PCT/JP2005/002312 filed 16 Feb. 2005, the entire content of which is hereby incorporated by reference.

TECHNICAL FIELD

The present invention relates to a semiconductor device having a trench-gate MOS (metal oxide semiconductor) structure, and a diode structure which is formed in parallel to the MOS structure.

BACKGROUND ART

In recent years, semiconductor devices having a power MOS FET (MOS field effect transistor) structure and also a trench-gate structure have been widely applied to various types of power supplies, such as a DC-DC converter. In an example of such semiconductor devices having a trench-gate power MOS FET, a Schottky barrier diode is formed in parallel to the MOS FET structure, so as to decrease the Vf (i.e., forward voltage (drop)). FIG. 23 shows a sectional structure of a conventional semiconductor device, which has a power MOS FET.

A drain layer 201, which includes high-concentration N-type impurities, forms an $N^+$-type silicon substrate. On the drain layer 201, a drift layer 202 is formed, which includes low-concentration N-type impurities. On the drift layer 202, P-type body areas 203 are formed, which include P-type impurities. In the vicinity of the surface of each P-type body area 203, a $P^+$-type diffusion area 204 is formed, which includes P-type impurities having a concentration higher than that of the P-type body area 203. On the surface of each P-type body area 203, $N^+$-type source areas 205 are also formed, which interpose the $P^+$-type diffusion area 204 and include high-concentration N-type impurities.

A plurality of trenches 206, each having a rectangular sectional shape, are formed in an area from the surfaces of the P-type body areas 203 to the drift layer 202. On the inner face (i.e., including side wall faces 206a and a bottom face 206b) of each trench 206, a gate insulating film 207 is formed. In the trench 206, a gate electrode 208 is formed, which is made of poly-silicon and is surrounded by the gate insulating film 207, an insulating film 220, and an inter-layer insulating film 218. In the drift layer 202, no structure corresponding to the P-type body areas 203, the $P^+$-type diffusion area 204, and the $N^+$-type source areas 205 is formed between the trench 206 which contacts the P-type body area 203, and another trench 206. Each P-type body area 203 is formed between two adjacent trenches 206.

In the uppermost part of the above-described structure, a source electrode film 210, made of metal, is formed. The source electrode film 210 is electrically connected to the $N^+$-type source areas 205 and the drift layer 202, and is insulated from the gate electrodes 208. The source electrode film 210 forms an Ohmic contact together with each $N^+$-type source area 205, and forms a Schottky contact together with the drift layer 202. On the back surface of the drain layer 201, a drain electrode film 211, made of metal, is formed. The drain electrode film 211 forms an Ohmic contact together with the drain layer 201.

The drain layer 201, the drift layer 202, the P-type body areas 203, the $N^+$-type source areas 205, the gate electrodes 208, the source electrode film 210, and the drain electrode film 211 form MOS FETs. In addition, the drain layer 201, the drift layer 202, and the source electrode film 210 form a Schottky barrier diode.

When the source electrode film 210 is grounded, a positive voltage is applied to the drain electrode film 211, and a positive voltage is also applied to each gate electrode 208, an inversion layer is formed at each interface between each P-type body area 203 and the relevant trenches 206, so that an electric current flows from the drain electrode film 211 to the source electrode film 210. In contrast, when the gate electrodes 208 and the drain electrode film 211 are grounded and a positive voltage is applied to the source electrode film 210, the PN junction between each P-type body area 203 and the drift layer 202, and the Schottky contact between the source electrode film 210 and the drift layer 202 are both set in forward bias conditions, so that an electric current flows from the source electrode film 210 to the drain electrode film 211. As the current also flows through the Schottky barrier diode, the Vf can be reduced in comparison with power MOS FETs which include no Schottky barrier diode. Patent Document 1 discloses a semiconductor device in which a Schottky barrier diode is formed in parallel to a trench-gate MOS FET structure.

Patent Document Published Japanese Translation, No. 2002-538602, of PCT International Publication, No. WO00/51167.

It is desired to reduce the Vf of power MOS FETs. On the other hand, conventional semiconductor devices having a trench-gate power MOS FET and a Schottky barrier diode have a problem in that when a reverse voltage is applied, a leakage current of the Schottky barrier diode increases in accordance with an increase in the temperature.

DISCLOSURE OF INVENTION

In light of the above circumstances, a first object of the present invention is to provide a semiconductor device for reducing the Vf, and a second object of the present invention is to provide a semiconductor device for reducing the leakage current of a parasitic diode, which is generated when a reverse current is applied.

Therefore, the present invention provides a semiconductor device comprising:

a first semiconductor layer, which has a first main surface and a second main surface which face each other, and is made of a semiconductor of a first conductive type;

a second semiconductor layer, which is exposed onto the first main surface, is made of a semiconductor of the first conductive type, and has an impurity concentration lower than that of the first semiconductor layer;

a plurality of trenches formed in a surface of the second semiconductor layer;

a gate insulating film formed in each of the trenches;

a gate electrode surrounded by the gate insulating film;

a first area of a second conductive type, which is formed in the surface of the second semiconductor layer, between two of the trenches;

a second area of the first conductive type, which is formed in a surface of the first area, and has an impurity concentration higher than that of the second semiconductor layer;

a third area of the second conductive type, which is formed in the surface of the second semiconductor layer, between one of the trenches, which is adjacent to the first area, and another one of the trenches;

a first electrode, which contacts surfaces of the second and third areas;

a second electrode, which contacts the second main surface, wherein:

the total amount of impurities, which function as impurities of the second conductive type in the first area, is larger than the total amount of impurities, which function as impurities of the second conductive type in the third area.

The concentration of impurities, which function as impurities of the second conductive type in the surface of the first area, may be higher than the concentration of impurities, which function as impurities of the second conductive type in the surface of the third area.

The distance from a boundary face between the first area and the second semiconductor layer to the surface of the first area may be longer than the distance from a boundary face between the third area and the second semiconductor layer to the surface of the third area.

The distance from a contact face between the first area and one of the two trenches, which interpose the first area, to a contact face between the first area and the other trench may be longer than the distance from a contact face between the third area and one of the two trenches, which interpose the third area, to a contact face between the third area and the other trench.

It is possible that:

in the surface of the second semiconductor layer, a fourth area of the second conductive type, which has a impurity concentration higher than that of the third area, and the third area are formed alternately along one of the trenches, so as to provide a plurality of the fourth areas and a plurality of the third areas; and the distance from a boundary face between the fourth area and the second semiconductor layer to a surface of the fourth area is longer than the distance from a boundary face between the third area and the second semiconductor layer to the surface of the third area.

The first electrode and the third area may form an Ohmic contact.

The first electrode may include trivalent metal.

The first electrode may include Al.

In the gate insulating film, the thickness of a part formed on the bottom face of each trench may be larger than that of a part formed on a side wall face of the trench.

In accordance with the present invention, the Vf can be reduced, and it is also possible to reduce the leakage current of a parasitic diode, which is generated when a reverse voltage is applied.

BEST MODE FOR CARRYING OUT THE INVENTION

Below, best modes for implementing the present invention will be explained with reference to the drawings.

Figure 1:
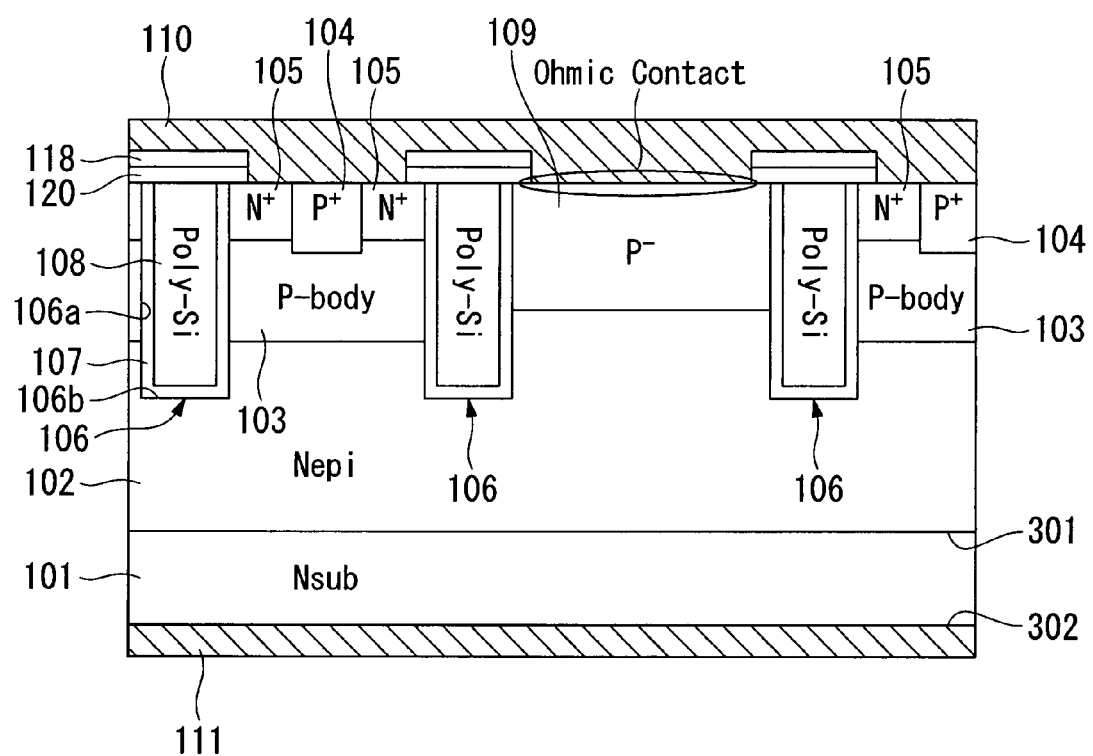
FIG. 1 is a sectional view showing a sectional structure of a semiconductor device as a first embodiment of the present invention.

FIG. 1 shows a sectional structure of a semiconductor device as a first embodiment of the present invention. A drain layer 101 having high-concentration N-type impurities has two main surfaces 301 and 302, which face each other. The drain layer 101 forms an $N^+$-type silicon substrate. On the main surface 301 of the drain layer 101, a drift layer 102 is formed, which include low-concentration N-type impurities. On the drift layer 102, P-type body areas 103 are formed, which include P-type impurities. On the surface of each P-type body area 103, a $P^+$-type diffusion area 104 is formed, which includes P-type impurities having a concentration higher than that of the P-type body area 103. On the surface of each P-type body area 103, $N^+$-type source areas 105 are also formed, which interpose the $P^+$-type diffusion area 104 and include high-concentration N-type impurities.

A plurality of trenches 106, each having a rectangular sectional shape, are formed in an area from the surfaces of the P-type body areas 103 to the drift layer 102. On the inner face (i.e., including side wall faces 106a and a bottom face 106b) of each trench 106, a gate insulating film 107 is formed. In the trench 106, a gate electrode 108 is formed, which is made of poly-silicon and is surrounded by the gate insulating film 107, an insulating film 120, and an inter-layer insulating film 118. On the surface of the drift layer 102, a $P^-$-type diffusion area 109 is formed between a trench 106, which contacts a P-type body area 103, and another trench 106, where the $P^-$-type diffusion area 109 includes low-concentration P-type impurities. This $P^-$-type diffusion area 109 is deep, from the surface of the drift layer 102 toward the inside thereof. Each P-type body area 103 is formed between two adjacent trenches 106. The P$^-$-type diffusion area 109 and each P-type body area 103 adjacent thereto interpose a trench 106. In each gate insulating film 107, the thickness of a part formed on the bottom face 106b of the trench 106 may be larger than that of a part formed on each side wall face 106a thereof. In this case, it is possible to provide a low electrostatic capacity.

In the uppermost part of the above-described structure, a source electrode film 110, made of metal, is formed. The source electrode film 110 is electrically connected to the N$^+$-type source areas 105 and the P$^-$-type diffusion area 109, and is insulated from the gate electrodes 108. The source electrode film 110 forms Ohmic contacts together with each N$^+$-type source area 105 and also with the P$^-$-type diffusion area 109. On the main surface 302 of the drain layer 101, a drain electrode film 111, made of metal, is formed. The drain electrode film 111 forms an Ohmic contact together with the drain layer 101.

The drain layer 101, the drift layer 102, the P-type body areas 103, the N$^+$-type source areas 105, the gate electrodes 108, the source electrode film 110, and the drain electrode film 111 form MOS FETs. In addition, the drain layer 101, the drift layer 102, the P$^-$-type diffusion area 109, and the source electrode film 110 form a diode.

In the above-described structure, the drift layer 102 is formed by depositing silicon, which includes N-type impurities, on the drain layer 101 by epitaxial growth. Each of the P-type body areas 103 is formed by injecting P-type impurities from the surface of the drift layer 102, and diffusing the impurities into an area having a specific depth (from the surface) at a high temperature. Each of the P$^+$-type diffusion areas 104 is formed by selectively injecting P-type impurities from the surface of each P-type body area 103, and diffusing the impurities into an area having a specific depth (from the surface) at a high temperature.

Each of the N$^+$-type source areas 105 is formed by selectively injecting N-type impurities from the surface of the relevant P-type body area 103, and diffusing the impurities into an area having a specific depth (from the surface) at a high temperature. In FIG. 1, the heights of the surfaces of the P-type body area 103, the P$^+$-type diffusion areas 104, and the N$^+$-type diffusion areas 105, which contact the source electrode film 110, are the same, however, they may be different from each other.

Each of the trenches 106 is formed by etching the drift layer 102, and reaches from the surface of the relevant P-type body area 103 to the drift layer 102. Each of the gate insulating films 107 is formed by oxidizing the surface of the relevant trench 106 in an oxygen atmosphere at a high temperature. Each gate electrode 108 is formed by depositing poly-silicon, which includes N-type impurities, on the surface of the corresponding gate insulating film 107.

Preferably, the source electrode film 110 includes trivalent metal (in particular, metal including Al), so as to provide a preferable Ohmic contact together with the P$^-$-type diffusion area 109. As the metal including Al, Al—Si and Al—Si—Cu are particularly preferable. Also preferably, the drain electrode film 111 is made of metal, which includes Ti, so as to provide a preferable Ohmic contact. As the metal including Ti, Ti—Ni—Ag and Ti—Ni—Au are particularly preferable.

The concentration of the impurities in the drain layer 101 may be $10^{19}$ to $10^{20}$ cm$^{-3}$. The concentration of the impurities at the surface of each P-type body area 103 may be $10^{17}$ to $10^{18}$ cm$^{-3}$. The concentration of the impurities at the surface of each P$^+$-type diffusion area 104 may be $10^{18}$ to $10^{19}$ cm$^{-3}$. The concentration of the impurities at the surface of each N$^+$-type source area 105 may be $10^{19}$ to $10^{20}$ cm$^{-3}$. The concentration of the impurities at the surface of the P$^-$-type diffusion area 109 may be $10^{16}$ to $10^{17}$ cm$^{-3}$.

When the source electrode film 110 is grounded, a positive voltage is applied to the drain electrode film 111, and a positive voltage is also applied to each gate electrode 108, an inversion layer is formed at each interface between each P-type body area 103 and the relevant trenches 106, so that an electric current flows from the drain electrode film 111 to the source electrode film 110. On the other hand, when the gate electrodes 108 and the drain electrode film 111 are grounded and a positive voltage is applied to the source electrode film 110, the PN junction between each P-type body area 103 and the drift layer 102, and the PN junction between the P$^-$-type diffusion area 109 and the drift layer 102 are both set in forward bias conditions, so that an electric current flows from the source electrode film 110 to the drain electrode film 111. As the current flows through the diode formed using the P$^-$-type diffusion area 109, whose total amount of the P-type impurities is less than that of each P-type body area 103, the Vf can be reduced.

As the source electrode film 110 forms an Ohmic contact together with the P$^-$-type diffusion area 109, the reverse withstand voltage of a parasitic diode, which consists of the P$^-$-type diffusion area 109 and the drift layer 102, can be increased in comparison with the reverse withstand voltage in a case in which the source electrode film 110 forms a Schottky contact together with the drift layer 102. Therefore, with respect to the whole semiconductor device, it is possible to reduce a leakage current, which flows through the parasitic diode when a reverse voltage is applied.

Figure 2:
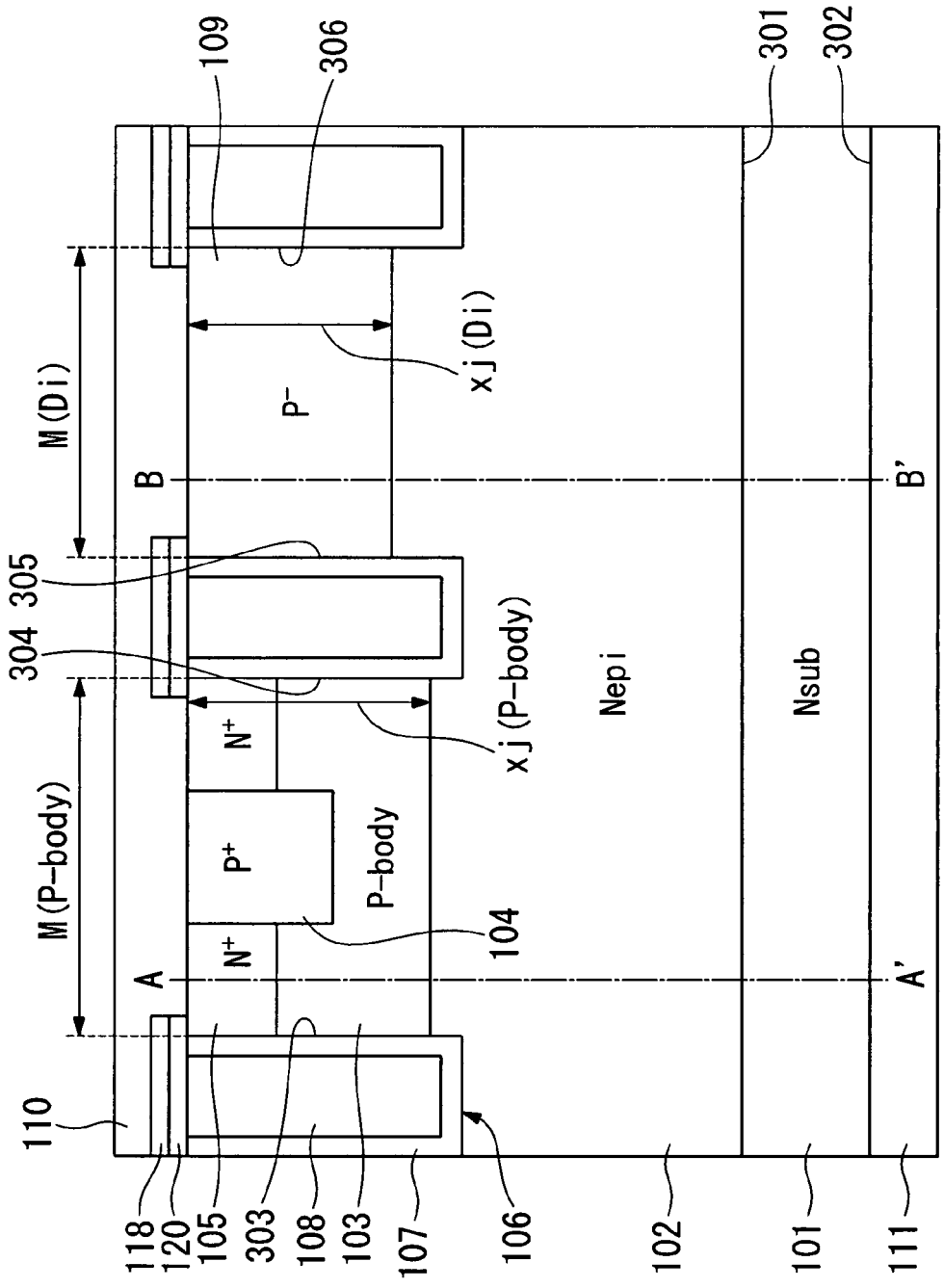
FIG. 2 is a diagram for explaining parameters with respect to the structure of the semiconductor device.
Figure 3A:
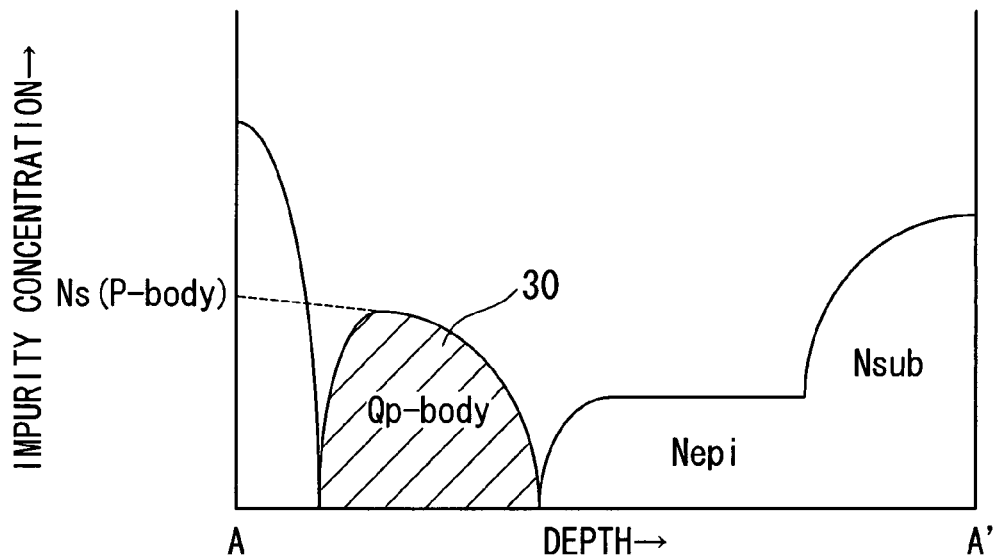
FIG. 3A is a diagram showing impurity concentrations at a section along line A-A' in FIG. 2.
Figure 3B:
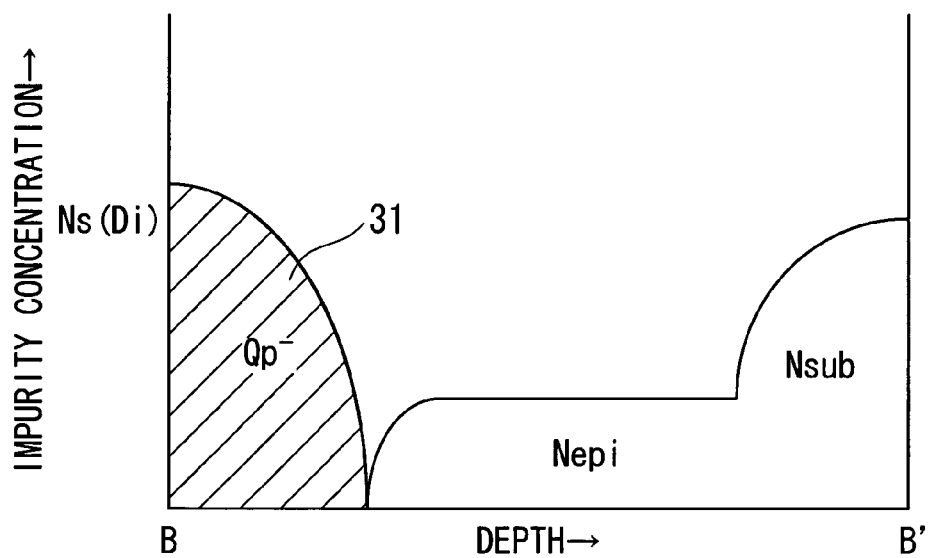
FIG. 3B is a diagram showing impurity concentrations at a section along line B-B' in FIG. 2.
Figure 4:
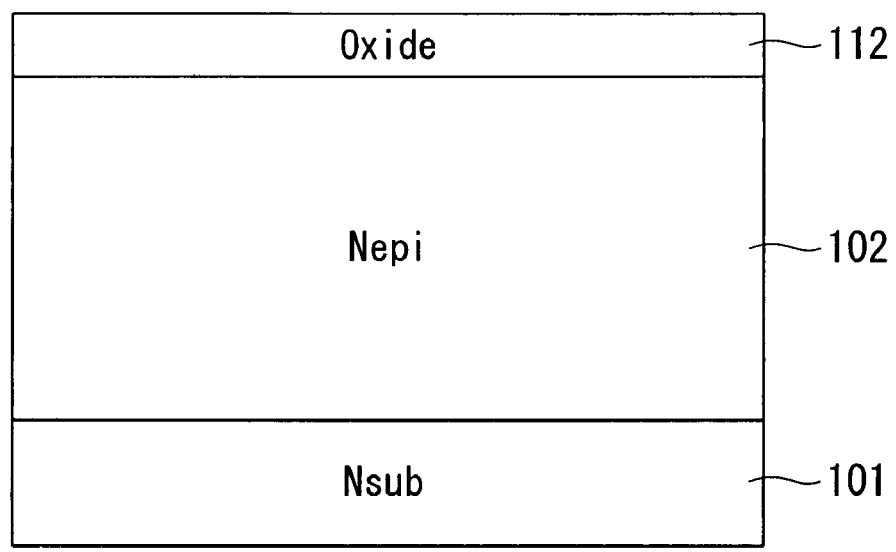
FIG. 4 is a sectional view for explaining a manufacturing process of the semiconductor device.
Figure 5:
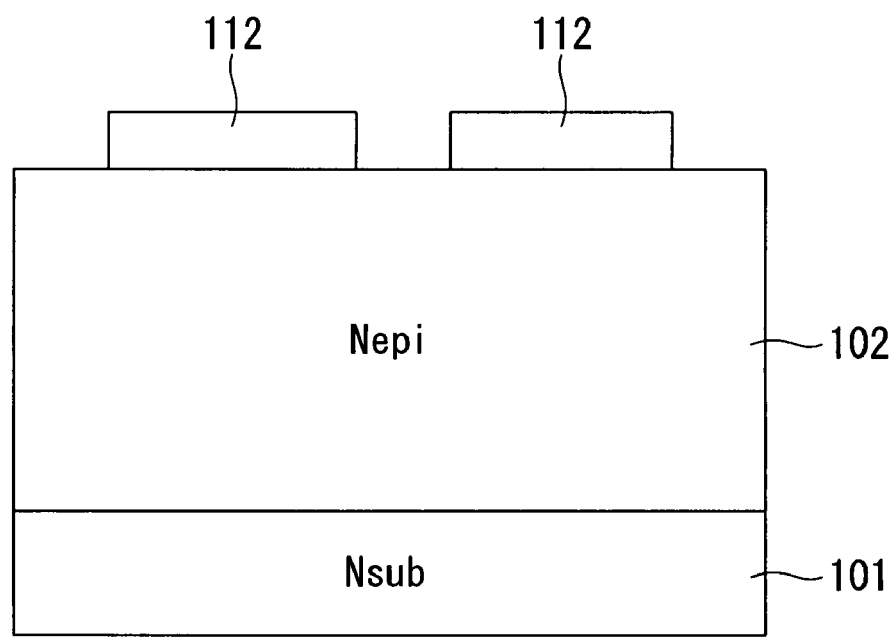
FIG. 5 is a sectional view for explaining a manufacturing process of the semiconductor device.

Below, parameters used in the present embodiment will be explained. FIGS. 2, 3A, and 3B are diagrams for explaining the parameters. A mesa width "M (P-body)" is a width of a mesa structure formed by each P-type body area 103, the relevant P$^+$-type diffusion area 104, and the relevant N$^+$-type source areas 105. That is, the mesa width "M (P-body)" corresponds to a distance from a contact face 303 between the P-type body area 103 and one of the trenches 106 which interpose the P-type body area 103, to a contact face 304 between the other trench 106 and the P-type body area 103.

A mesa width "M (Di)" is the width of a mesa structure formed by the P$^-$-type diffusion area 109. That is, the mesa width "M (Di)" corresponds to a distance from a contact face 305 between the P$^-$-type diffusion area 109 and one of the trenches 106 which interpose the P$^-$-type diffusion area 109, to a contact face 306 between the other trench 106 and the P$^-$-type diffusion area 109. A depth "xj (P-body)" indicates the distance from a joint surface between each N$^+$-type source areas 105 and the source electrode film 110 to a boundary face between the drift layer 102 and the relevant P-type body area 103. A depth "xj (Di)" indicates the distance from a joint surface between the P$^-$-type diffusion area 109 and the source electrode film 110 to a boundary face between the drift layer 102 and the P$^-$-type diffusion area 109.

FIG. 3A indicates impurity concentrations at a section along line A-A', drawn in a direction perpendicular to the main surface 301 in FIG. 2. FIG. 3B indicates impurity concentrations at a section along line B-B', drawn in a direction perpendicular to the main surface 301 in FIG. 2. The impurity concentrations in each figure are net impurity concentrations. In an area including both P-type and N-type impurities, a net impurity concentration is obtained by subtracting the impurity concentration with respect to one conductive type having a higher concentration from the impurity concentration with respect to the other conductive type having a lower concentration. The total amount "Qp-body" of the impurity concentration in the relevant P-type body area 103 corresponds to a value of integration with respect to the impurity concentration, for a range from the boundary face between the relevant $N^+$-type source areas 105 and the P-type body area 103 to the boundary face between the P-type body area 103 and the drift layer 102, that is, an area 30 in FIG. 3A. A total amount "Qp$^-$" of the impurity concentration in the P$^-$-type diffusion area 109 corresponds to a value of integration with respect to the impurity concentration, for a range from the joint face between the source electrode film 110 and the P$^-$-type diffusion area 109 to the boundary face between the P$^-$-type diffusion area 109 and the drift layer 102, that is, an area 31 in FIG. 3B.

When forming each P-type body area 103, P-type impurities are injected into a specific surface area of the drift layer 102, and the impurities are diffused at a high temperature. A surface concentration "Ns (P-body)" of the P-type body area 103 is a concentration of impurities which function as P-type impurities on the surface of the drift layer 102 after the above diffusion. On the other hand, also when forming the P$^-$-type diffusion area 109, P-type impurities are injected into a specific surface area of the drift layer 102, and the impurities are diffused at a high temperature. A surface concentration "Ns (Di)" of the P$^-$-type diffusion area 109 is a concentration of impurities which function as P-type impurities on the surface of the drift layer 102 after the above diffusion.

The semiconductor device of the present embodiment provides a low Vf by satisfying one of the following conditions (1) to (3), or any combination of the conditions. In addition, the semiconductor device of the present embodiment provides a field modulation effect by satisfying the following condition (4).

(1) The surface concentration "Ns (P-body)" of the P-type body area 103 is greater than the surface concentration "Ns (Di)" of the P$^-$-type diffusion area 109.
(2) The depth "xj (P-body)" is greater than the depth "xj (Di)".
(3) The total amount "Qp-body" of the P-type body area 103 is greater than the total amount "Qp$^-$" of the P$^-$-type diffusion area 109.
(4) The mesa width "M (P-body)" is greater than the mesa width "M (Di)".

When the above condition (1), (2), or (3) is satisfied, the potential barrier generated between the P$^-$-type diffusion area 109 and the drift layer 102 can be reduced. Thus, it is possible to further reduce the Vf when operating the parasitic diode formed by the P$^-$-type diffusion area 109 and the drift layer 102. The condition (1) relates to ideal surface concentrations. However, similar effects can be obtained when impurity concentrations at the vicinity of the relevant surfaces satisfy the condition (1).

When a reverse voltage is applied, an edge part where each side wall face 106a and the bottom face 106b contact each other has a maximum electric field, and the withstand voltage of the whole semiconductor device depends on the withstand voltage of such edge parts. When the above condition (1), (2) or (3) is satisfied, for example, the condition (2) is satisfied so that the depth of the P$^-$-type diffusion area 109 is smaller that of the P-type body area 103, a secondary problem may occur, such that the field intensity may increase at the edge parts, depending on design conditions. Even in that case, when the condition (4) is satisfied, that is, the mesa width "M (Di)" is decreased so as to satisfy "M (P-body)>M (Di)", the electric field at each edge part can be modulated and the withstand voltage of the whole semiconductor device can be increased.

Below, the method of manufacturing the semiconductor device will be explained with reference to FIGS. 4 to 12. The drift layer 102 is formed on the drain layer 101 by epitaxial growth, and an oxide such as $SiO_2$ is deposited on the drift layer 102, so that an oxide film 112 is formed (see FIG. 4). Next, a resist is deposited on the oxide film 112, and a resist pattern is formed by means of photo processes (i.e., exposure and development). The oxide film 112 is etched using this resist pattern as a mask, so as to expose the surface of the drift layer 102. The resist is then removed (see FIG. 5).

Figure 6:
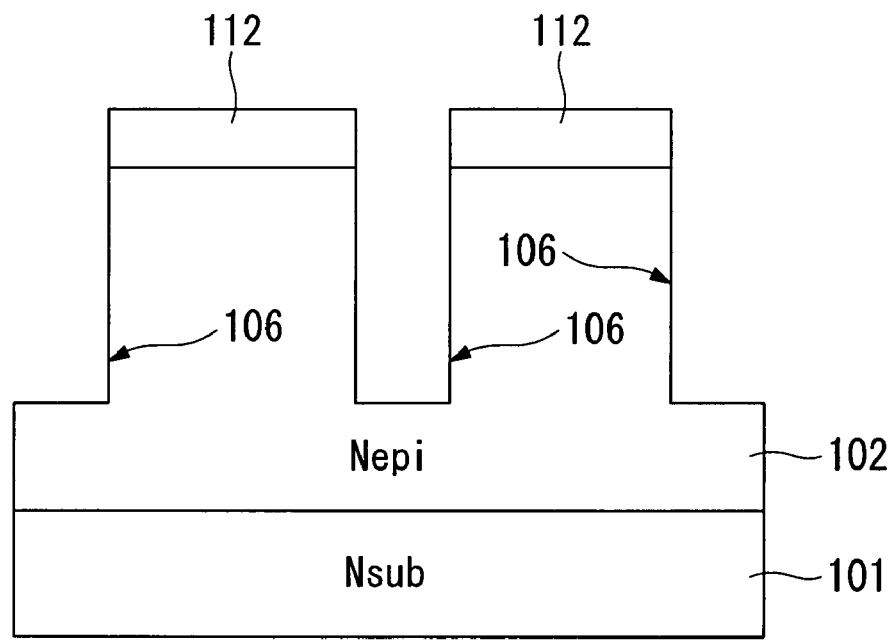
FIG. 6 is a sectional view for explaining a manufacturing process of the semiconductor device.
Figure 7:
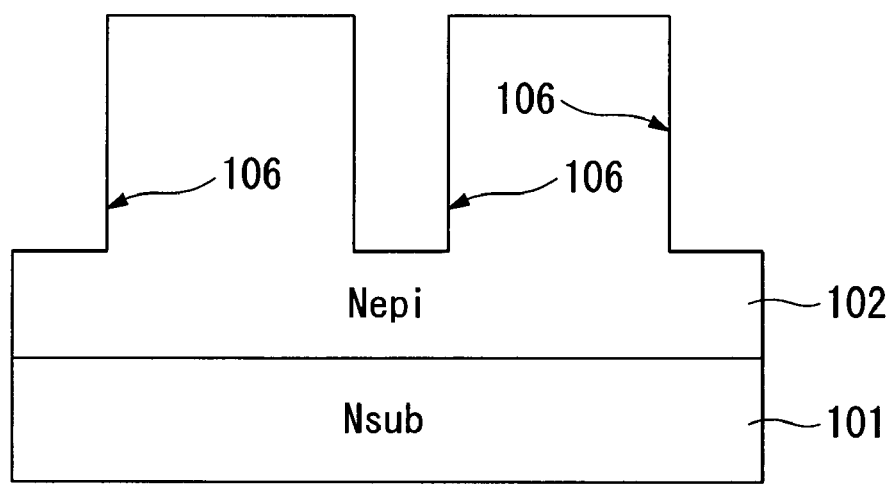
FIG. 7 is a sectional view for explaining a manufacturing process of the semiconductor device.
Figure 8:
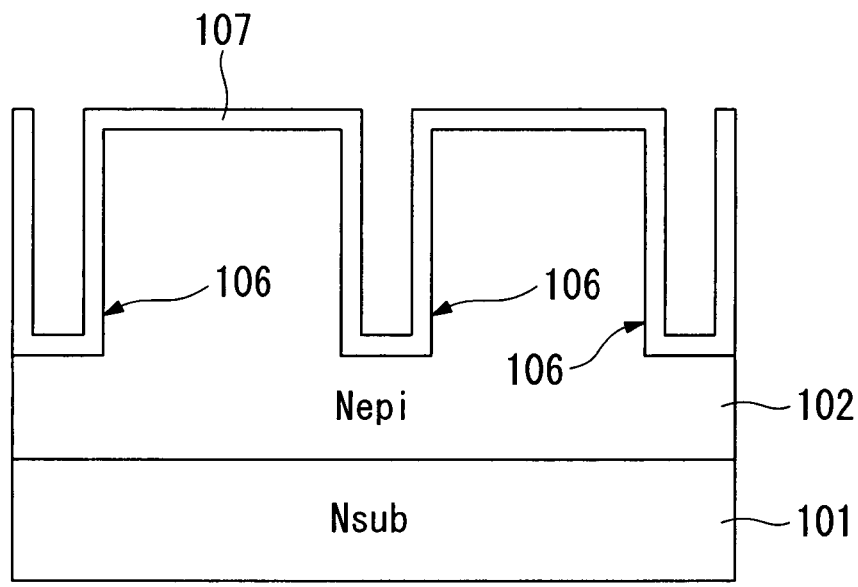
FIG. 8 is a sectional view for explaining a manufacturing process of the semiconductor device.
Figure 9:
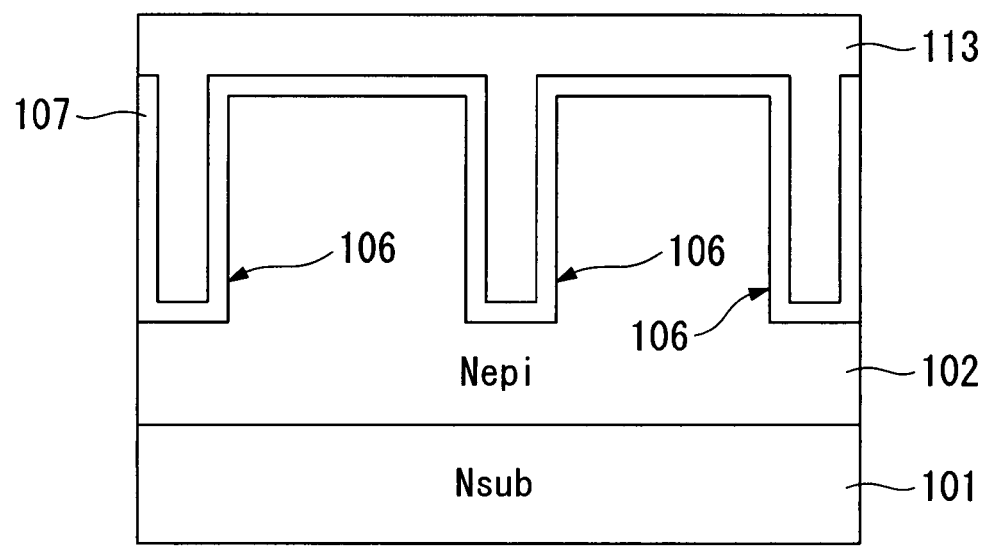
FIG. 9 is a sectional view for explaining a manufacturing process of the semiconductor device.
Figure 10:
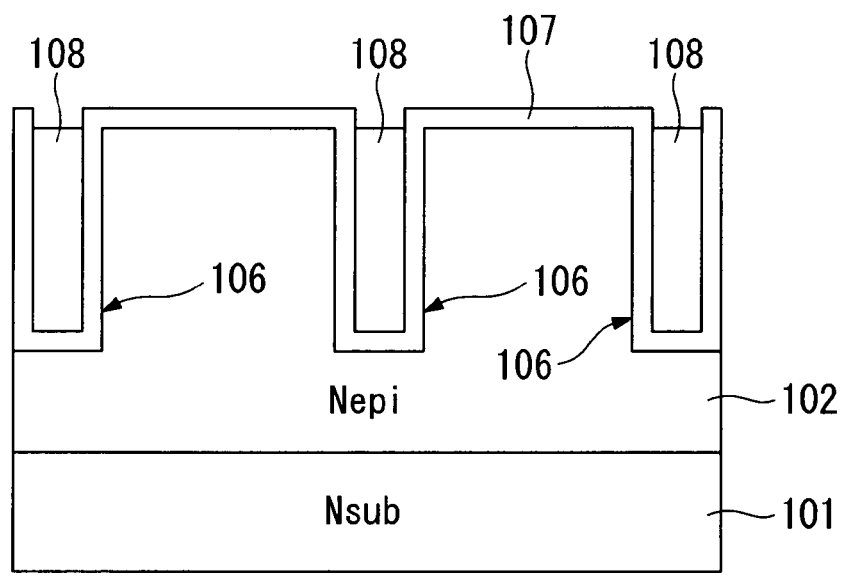
FIG. 10 is a sectional view for explaining a manufacturing process of the semiconductor device.

Next, the drift layer 102 is etched using the pattern of the oxide film 112 as a mask, so as to form the trenches 106 (see FIG. 6). Then the oxide film 112 is removed (see FIG. 7), and the gate insulating film 107 is formed by thermal oxidation performed in a high-temperature oxygen atmosphere (see FIG. 8). Next, poly-silicon is deposited so as to fill the trenches 106, thereby forming a poly-silicon film 113 (see FIG. 9). The poly-silicon film 113 is etched so as to have a height similar to that of the surface of the drift layer 102, thereby forming the gate electrodes 108 (see FIG. 10).

Figure 11:
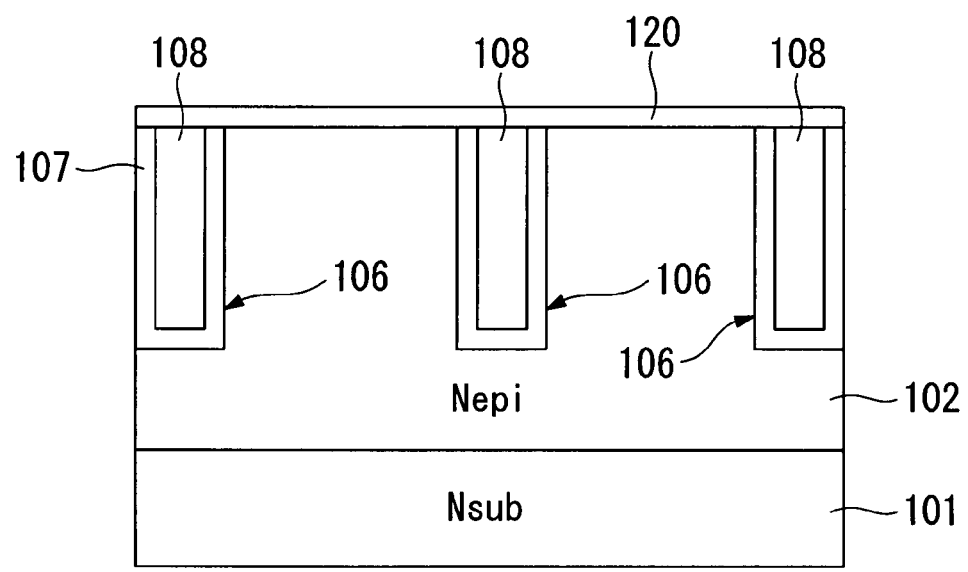
FIG. 11 is a sectional view for explaining a manufacturing process of the semiconductor device.
Figure 12:
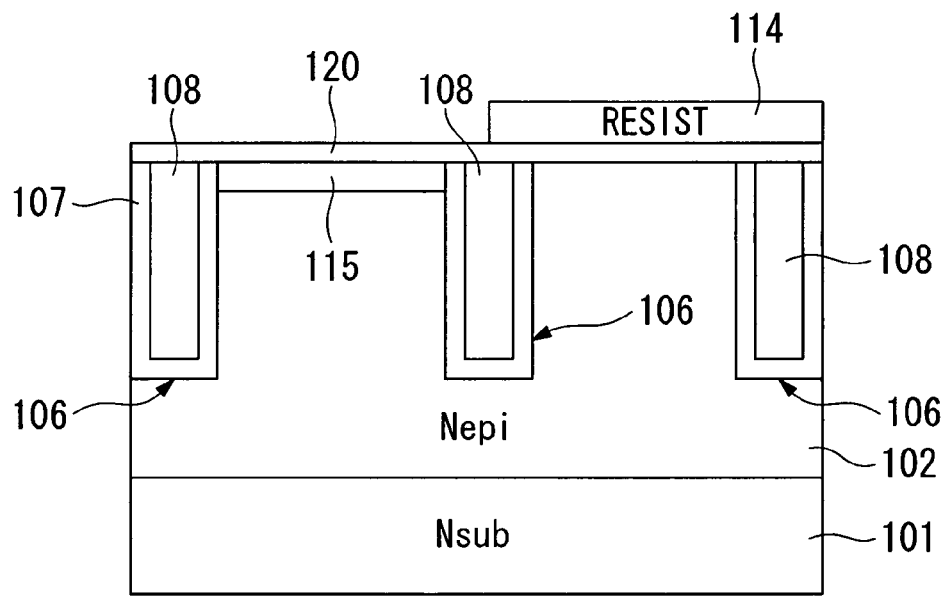
FIG. 12 is a sectional view for explaining a manufacturing process of the semiconductor device.
Figure 13:
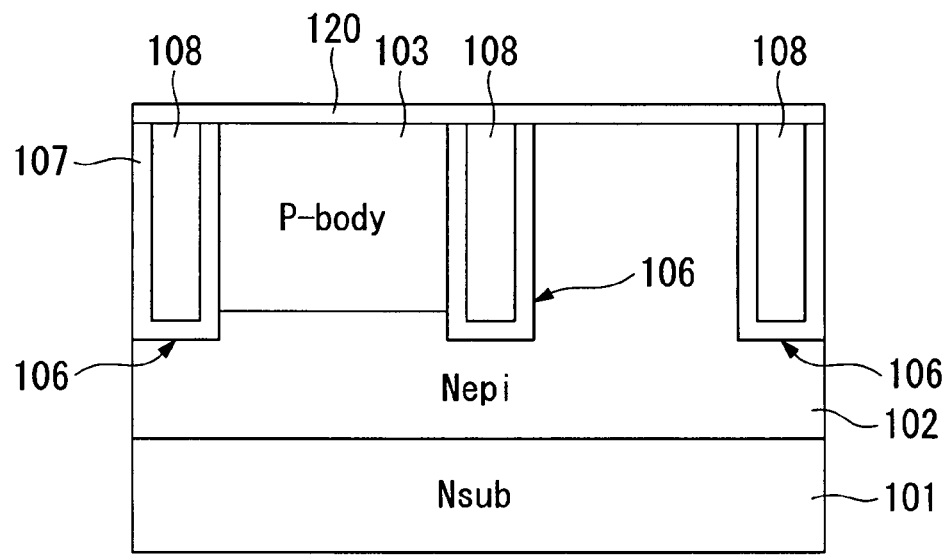
FIG. 13 is a sectional view for explaining a manufacturing process of the semiconductor device.

Next, the gate insulating film 107 is etched to have the same height as that of the upper surfaces of the gate electrodes 108, and thermal oxidation is performed in a high-temperature oxygen atmosphere, so as to cover the gate electrodes 108 and the drift layer 102 with the insulating film 120 (see FIG. 11). A resist is deposited on the insulating film 120, and a pattern of a resist film 114 is formed by means of photo processes. P-type impurities, such as B (boron), are injected into the surface of the drift layer 102 using the resist film 114 as a mask, thereby forming an injection layer 115 (see FIG. 12). When the resist film 114 is removed and annealing is performed at a high temperature, boron in the injection layer 115 is diffused into the drift layer 102, thereby forming the P-type body area 103 (see FIG. 13).

Figure 14:
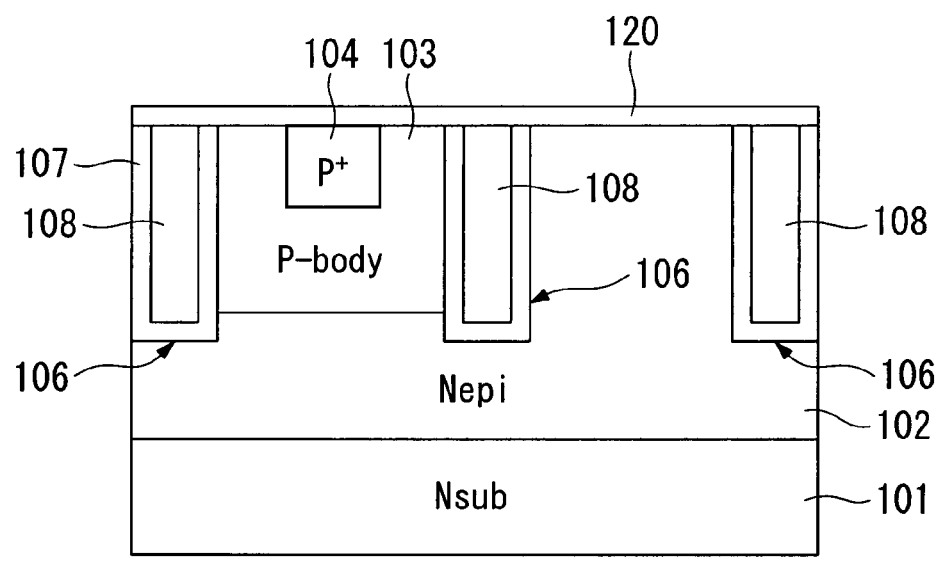
FIG. 14 is a sectional view for explaining a manufacturing process of the semiconductor device.
Figure 15:
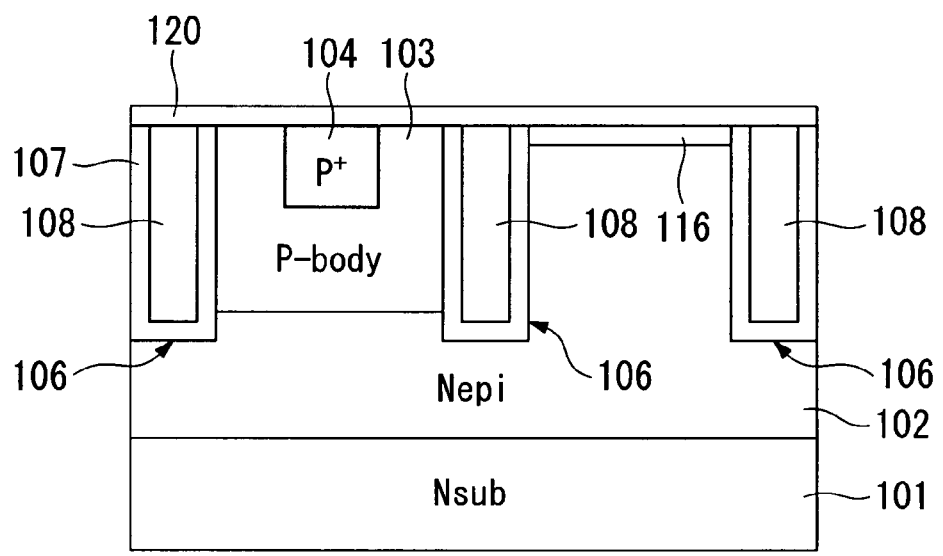
FIG. 15 is a sectional view for explaining a manufacturing process of the semiconductor device.

Next, a resist is deposited on the surface of the insulating film 120 again, and a pattern of a resist film is formed, in which the insulating film 120 is exposed on the P-type body area 103, by means of photo processes. B (boron) is injected into the surface of the P-type body area 103, using the above resist film as a mask. When the resist film is removed and annealing is performed at a high temperature, the P$^+$-type diffusion area 104 is formed (see FIG. 14). A resist is deposited on the insulating film 120 again, and photo processes are performed so as to form a pattern of a resist film, in which the insulating film 120 is exposed on the drift layer 102 between a trench 106 adjacent to the P-type body area 103, and another trench 106 adjacent to this trench 106. B is injected into the surface of the drift layer 102 using the resist film as a mask, and the resist film is then removed, thereby forming an injection layer 116 (see FIG. 15).

Figure 16:
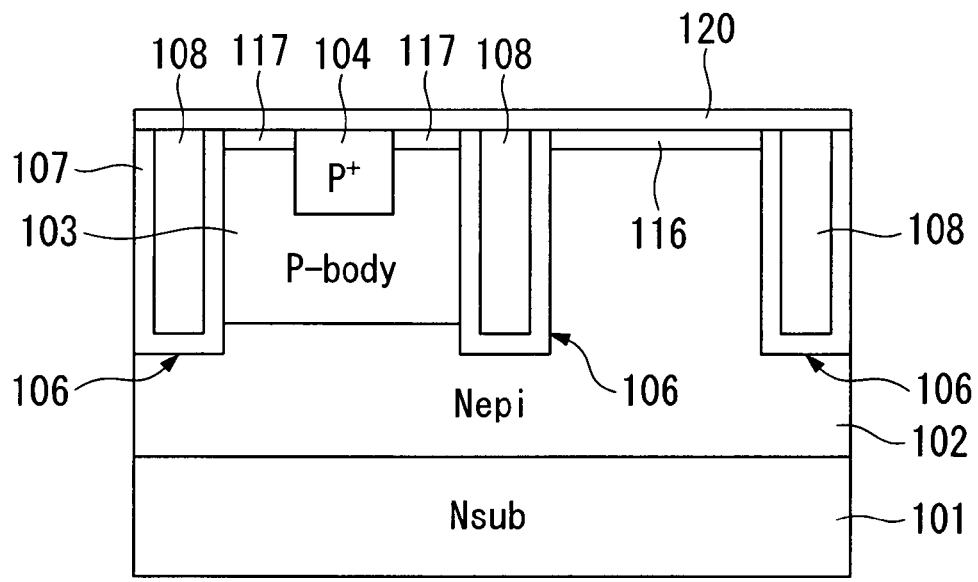
FIG. 16 is a sectional view for explaining a manufacturing process of the semiconductor device.
Figure 17:
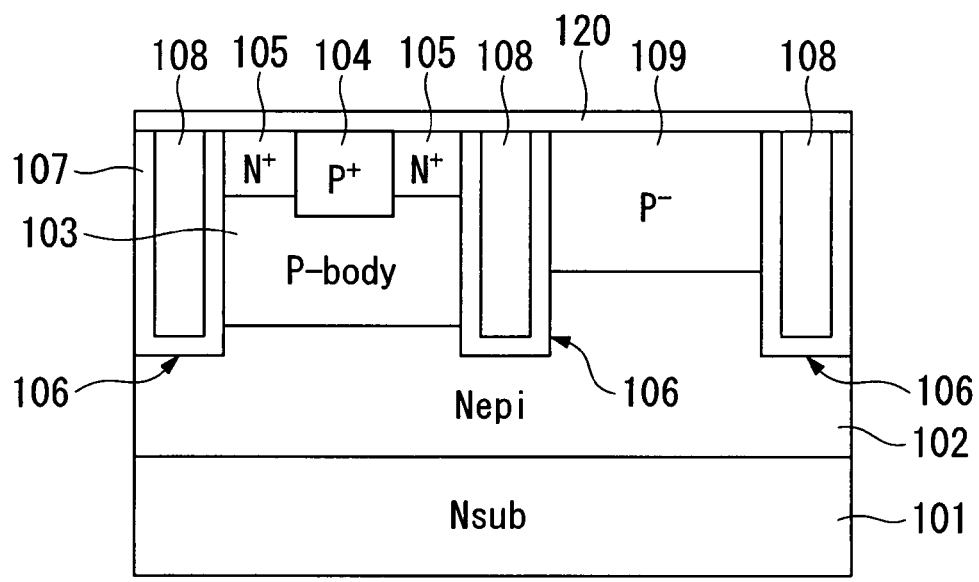
FIG. 17 is a sectional view for explaining a manufacturing process of the semiconductor device.

Next, a resist is deposited on the surface of the insulating film 120 again, and a pattern of a resist film is formed by means of photo processes, in which the insulating film 120 is exposed on areas (in the P-type body area 103) which include no P$^+$-type diffusion area 104. Then As (arsenic) is injected into the surface of such areas (in the P-type body area 103) which include no P$^+$-type diffusion area 104, and the resist film is removed, thereby forming injection layers 117 (see FIG. 16). Next, when annealing is performed at a high temperature, B in the injection layer 116, formed on the surface of the drift layer 102, is diffused into the drift layer 102, and As in the injection layers 117, formed on the surface of the P-type body area 103, is diffused into the P-type body area 103, thereby forming the P$^-$-type diffusion area 109 and the $N^+$-type source areas 105 (see FIG. 17).

Figure 18:
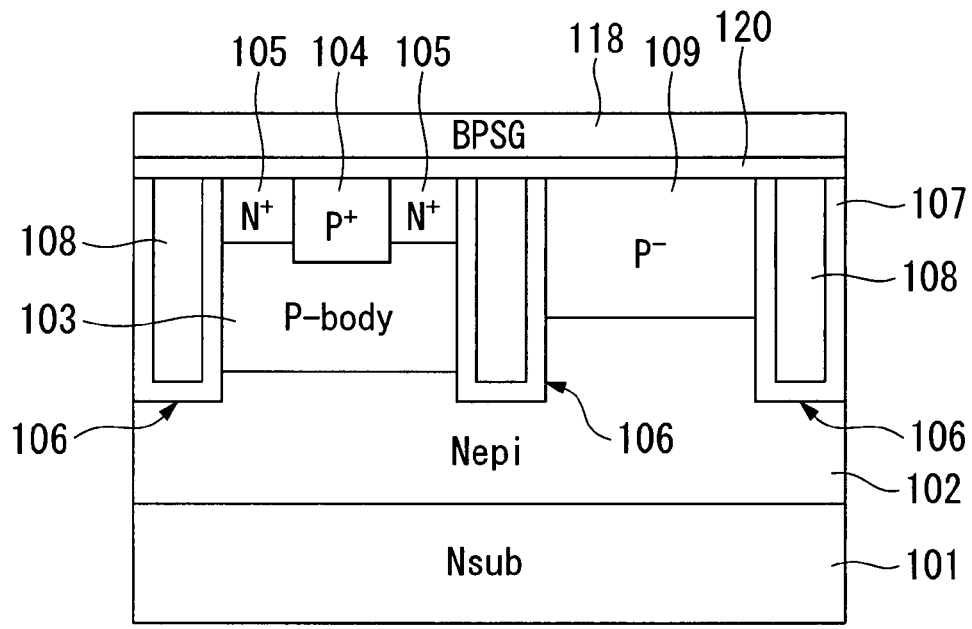
FIG. 18 is a sectional view for explaining a manufacturing process of the semiconductor device.
Figure 19:
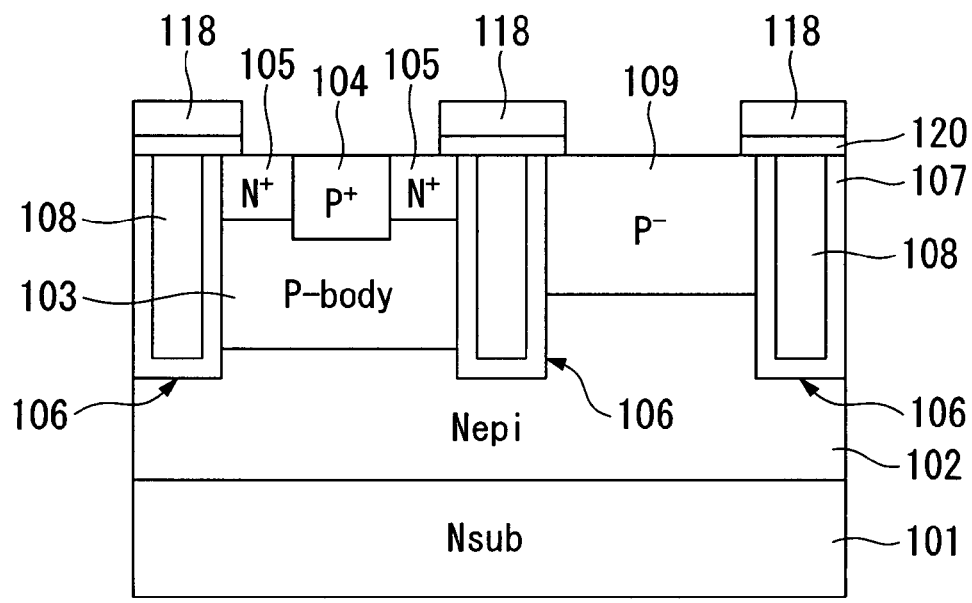
FIG. 19 is a sectional view for explaining a manufacturing process of the semiconductor device.
Figure 20:
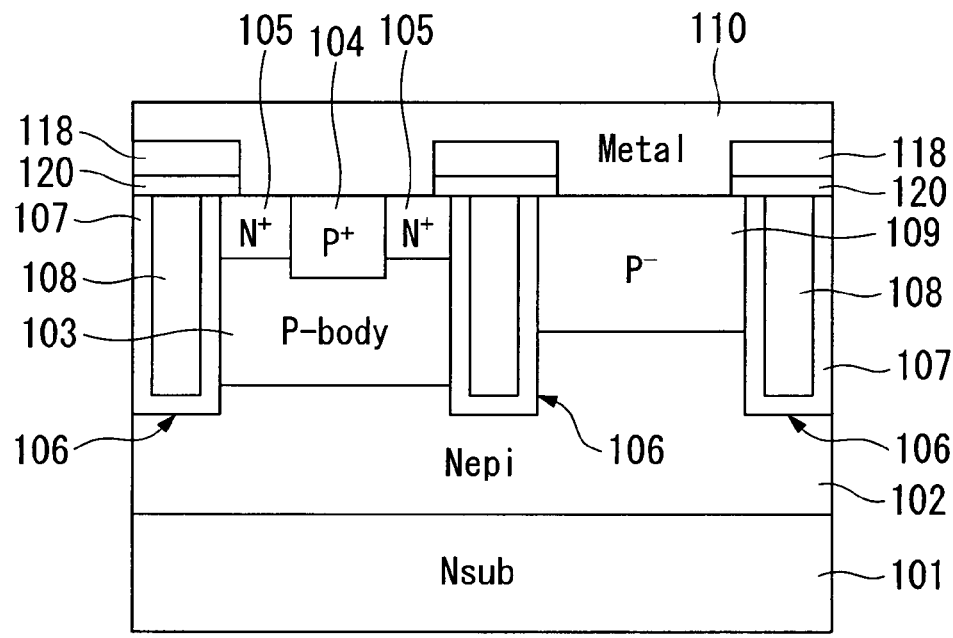
FIG. 20 is a sectional view for explaining a manufacturing process of the semiconductor device.
Figure 21:
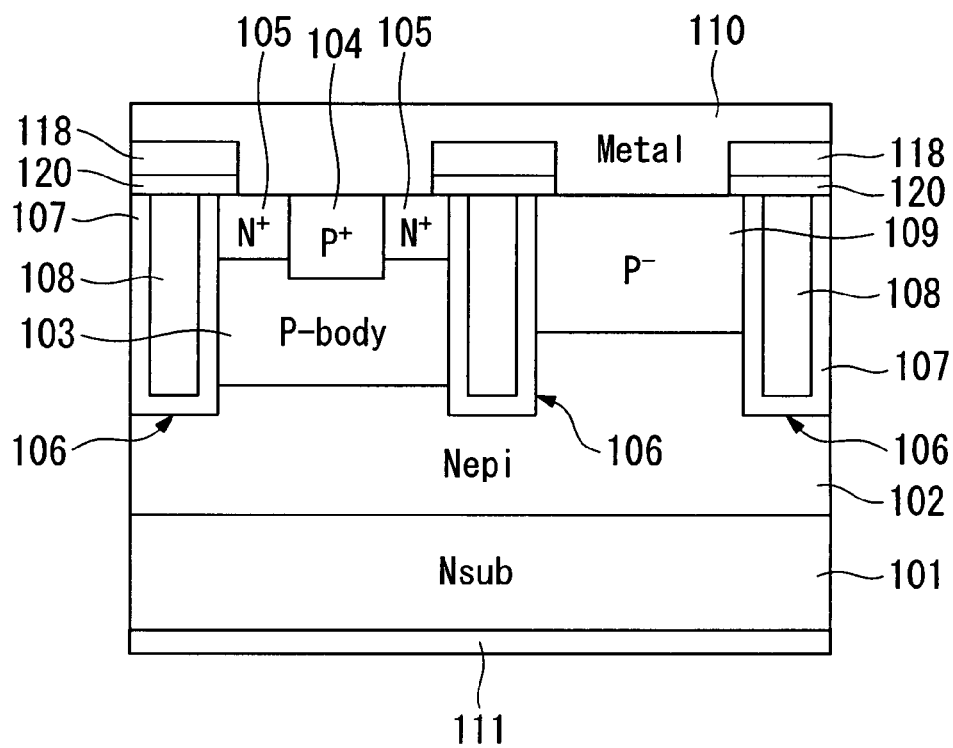
FIG. 21 is a sectional view for explaining a manufacturing process of the semiconductor device.

Next, BPSG is deposited on the insulating film 120, so that the inter-layer insulating film 118 is formed (see FIG. 18). A resist is deposited on the inter-layer insulating film 118, and photo processes are performed so as to form a pattern of a resist film, in which the resist remains on the gate electrodes 108. The inter-layer insulating film 118 and the insulating film 120 are etched using the resist film as a mask (see FIG. 19). Next, an electrode material is deposited onto the surface of the drift layer 102 so that the source electrode film 110 is formed (see FIG. 20), and an electrode material is also deposited on the surface of the drain layer 101 so that the drain electrode film 111 is formed (see FIG. 21).

Figure 22:
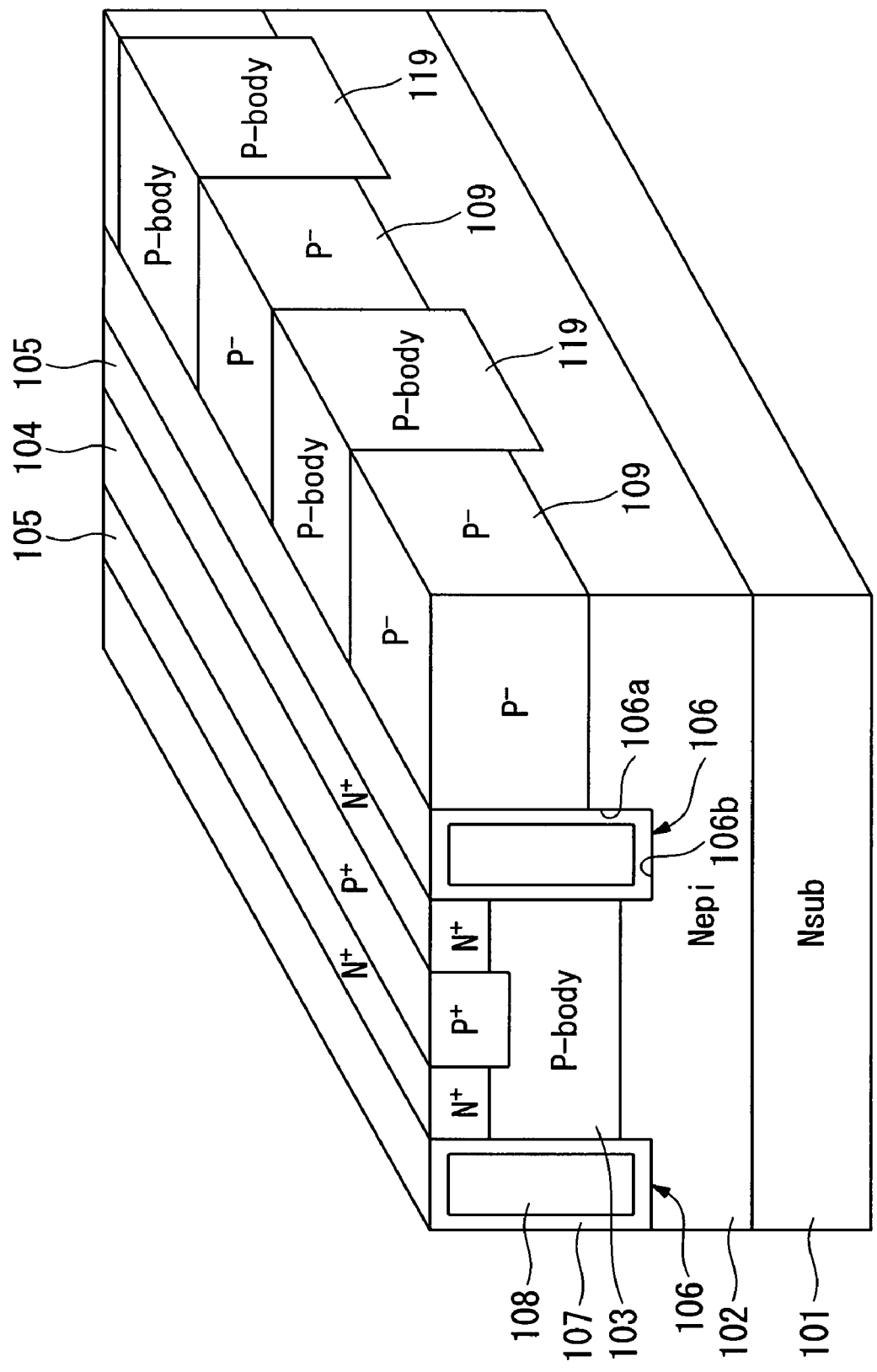
FIG. 22 is a sectional view showing a sectional structure of a semiconductor device as a second embodiment of the present invention.
Figure 23:
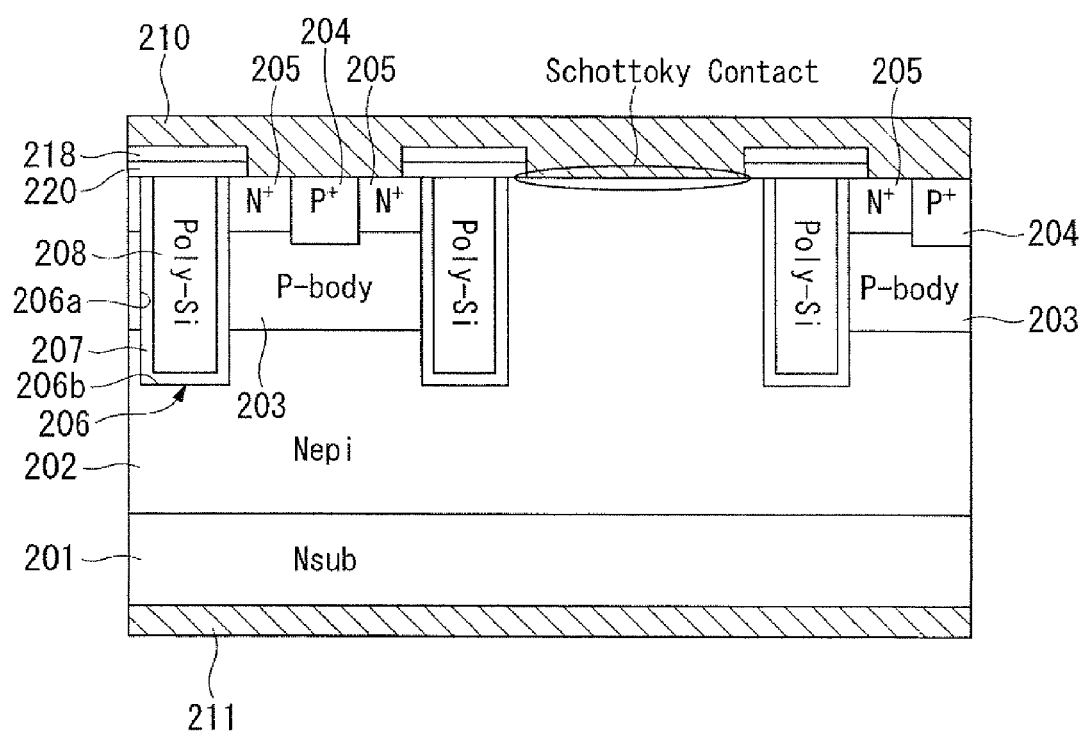
FIG. 23 is a sectional view showing a sectional structure of a conventional semiconductor device.

Below, a second embodiment of the present invention will be explained. FIG. 22 is a perspective view of the semiconductor device in the present embodiment. The P⁻-type diffusion area 109 and a P-type body area 119 are alternately formed along a side wall face 106a of a trench 106 which contacts each P⁻-type diffusion area 109. The impurity concentration at the surface of each P-type body area 119 may be $10^{17}$ to $10^{18}$ cm$^{-3}$. The distance from the surface of the P-type body area 119 to the boundary face between the P-type body area 119 and the drift layer 102 is longer than the distance from the surface of the P⁻-type diffusion area 109 to the boundary face between the P⁻-type diffusion area 109 and the drift layer 102. That is, the P-type body area 119 is deeper than the P⁻-type diffusion area 109. When the distance between the bottom of the P⁻-type diffusion area 109 and the bottom face 106b of the trench 106 is increased, the withstand voltage is decreased. Therefore, as described above, the P-type body areas 119, which are deeper than the P⁻-type diffusion areas 109, are formed, thereby improving the withstand voltage.

While embodiments of the present invention have been described with reference to the drawings, concrete structures are not limited to the above embodiments, and design modifications or the like can be made without departing from the scope of the present invention.

INDUSTRIAL APPLICABILITY

It is possible to reduce the Vf. It is also possible to reduce the leakage current of a parasitic diode, which is generated when a reverse voltage is applied.

The invention claimed is:

1. A semiconductor device comprising:
    a first semiconductor layer, which has a first main surface and a second main surface which face each other, and is made of a semiconductor of a first conductive type;
    a second semiconductor layer, which is exposed onto the first main surface, is made of a semiconductor of the first conductive type, and has an impurity concentration lower than that of the first semiconductor layer;
    a plurality of trenches formed in a surface of the second semiconductor layer;
    a gate insulating film formed in each of the trenches;
    a gate electrode surrounded by the gate insulating film;
    a first area of a second conductive type, which is formed in the surface of the second semiconductor layer, between two of the trenches;
    second areas of the first conductive type, which are formed in a surface of the first area, and have an impurity concentration higher than that of the second semiconductor layer, wherein the second areas interpose an area of the second conductive type, which has an impurity concentration higher than that of the first area;
    a third area of the second conductive type, which is formed in the surface of the second semiconductor layer, between one of the trenches, which is adjacent to the first area, and another one of the trenches, in a manner such that said one of the trenches, which is adjacent to the first area, is interposed between the first area and the third area;
    a first electrode, which contacts surfaces of the second and third areas;
    a second electrode, which contacts the second main surface, wherein:
    the total amount of impurities, which function as impurities of the second conductive type in the first area, is larger than the total amount of impurities, which function as impurities of the second conductive type in the third area.

2. The semiconductor device in accordance with claim 1, wherein the concentration of impurities, which function as impurities of the second conductive type in the surface of the first area, is higher than the concentration of impurities, which function as impurities of the second conductive type in the surface of the third area.

3. The semiconductor device in accordance with claim 1, wherein the distance from a boundary face between the first area and the second semiconductor layer to the surface of the first area is longer than the distance from a boundary face between the third area and the second semiconductor layer to the surface of the third area.

4. The semiconductor device in accordance with claim 1, wherein the distance from a contact face between the first area and one of the two trenches, which interpose the first area, to a contact face between the first area and the other trench is longer than the distance from a contact face between the third area and one of the two trenches, which interpose the third area, to a contact face between the third area and the other trench.

5. The semiconductor device in accordance with claim 1, wherein:
    in the surface of the second semiconductor layer, a fourth area of the second conductive type, which has a impurity concentration higher than that of the third area, and the third area are formed alternately along one of the trenches, so as to provide a plurality of the fourth areas and a plurality of the third areas; and
    the distance from a boundary face between the fourth area and the second semiconductor layer to a surface of the fourth area is longer than the distance from a boundary face between the third area and the second semiconductor layer to the surface of the third area.

6. The semiconductor device in accordance with claim 1, wherein the first electrode and the third area form an Ohmic contact.

7. The semiconductor device in accordance with claim 1, wherein the first electrode includes trivalent metal.

8. The semiconductor device in accordance with claim 1, wherein the first electrode includes Al.

9. The semiconductor device in accordance with claim 1, wherein in the gate insulating film, the thickness of a part formed on the bottom face of each trench is larger than that of a part formed on a side wall face of the trench.

* * * * *